(12) United States Patent
Chanumolu et al.

(10) Patent No.: US 12,727,516 B2
(45) Date of Patent: Sep. 1, 2026

(54) INTEGRATED CIRCUITS WITH SELECTABLE PACKAGING TYPES

(71) Applicant: Micron Technology, Inc., Boise, ID (US)

(72) Inventors: Kishan Chanumolu, Bengaluru (IN); Sandeep Dwivedi, Bengaluru (IN)

(73) Assignee: Micron Technology, Inc., Boise, ID (US)

( * ) Notice: Subject to any disclaimer, the term of this patent is extended or adjusted under 35 U.S.C. 154(b) by 294 days.

(21) Appl. No.: 18/441,462

(22) Filed: Feb. 14, 2024

(65) Prior Publication Data

US 2024/0282730 A1 Aug. 22, 2024

Related U.S. Application Data

(60) Provisional application No. 63/446,710, filed on Feb. 17, 2023.

(51) Int. Cl.

| | |
|---|---|
| ***H10W 90/00*** | (2026.01) |
| ***H10W 70/60*** | (2026.01) |
| ***H10W 70/63*** | (2026.01) |
| *H10W 72/00* | (2026.01) |
| *H10W 72/90* | (2026.01) |

(52) U.S. Cl.

CPC .......... *H10W 90/00* (2026.01); *H10W 70/611* (2026.01); *H10W 70/635* (2026.01); *H10W 72/072* (2026.01); *H10W 72/075* (2026.01); *H10W 72/9445* (2026.01); *H10W 90/724* (2026.01); *H10W 90/754* (2026.01)

(58) Field of Classification Search

CPC .. H10B 80/00; H10W 70/611; H10W 70/614; H10W 70/616; H10W 70/635; H10W 72/00; H10W 72/072; H10W 72/075; H10W 72/20; H10W 72/50; H10W 72/90; H10W 72/9445; H10W 90/00; H10W 90/701; H10W 90/724; H10W 90/726; H10W 90/754; H10W 90/756

See application file for complete search history.

(56) References Cited

U.S. PATENT DOCUMENTS 11,145,579 B1 * 10/2021 Kinzer ................ H10W 70/481

* cited by examiner

*Primary Examiner* — Cheung Lee

(74) *Attorney, Agent, or Firm* — Brooks, Cameron & Huebsch, PLLC

(57) ABSTRACT

An apparatus includes a die with a first face, a second face opposite the first face, and a third face located between the first face and the second face, I/O cells coupled to the first face of a die, where the I/O cells are configured to be selectively bonded to a package by wirebonded interconnections at a first pitch or flip-chip interconnections at a second pitch that is larger than the first pitch, and a bond area including decoupling capacitors that is located between each I/O cell and the third face of the die.

20 Claims, 9 Drawing Sheets

INTEGRATED CIRCUITS WITH SELECTABLE PACKAGING TYPES

PRIORITY INFORMATION

This application claims the benefit of U.S. Provisional Application No. 63/446,710, filed on Feb. 17, 2023, the contents of which are incorporated herein by reference.

TECHNICAL FIELD

Embodiments of the disclosure are generally related to memory sub-systems, and more specifically, are related to integrated circuits with selectable packaging types.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
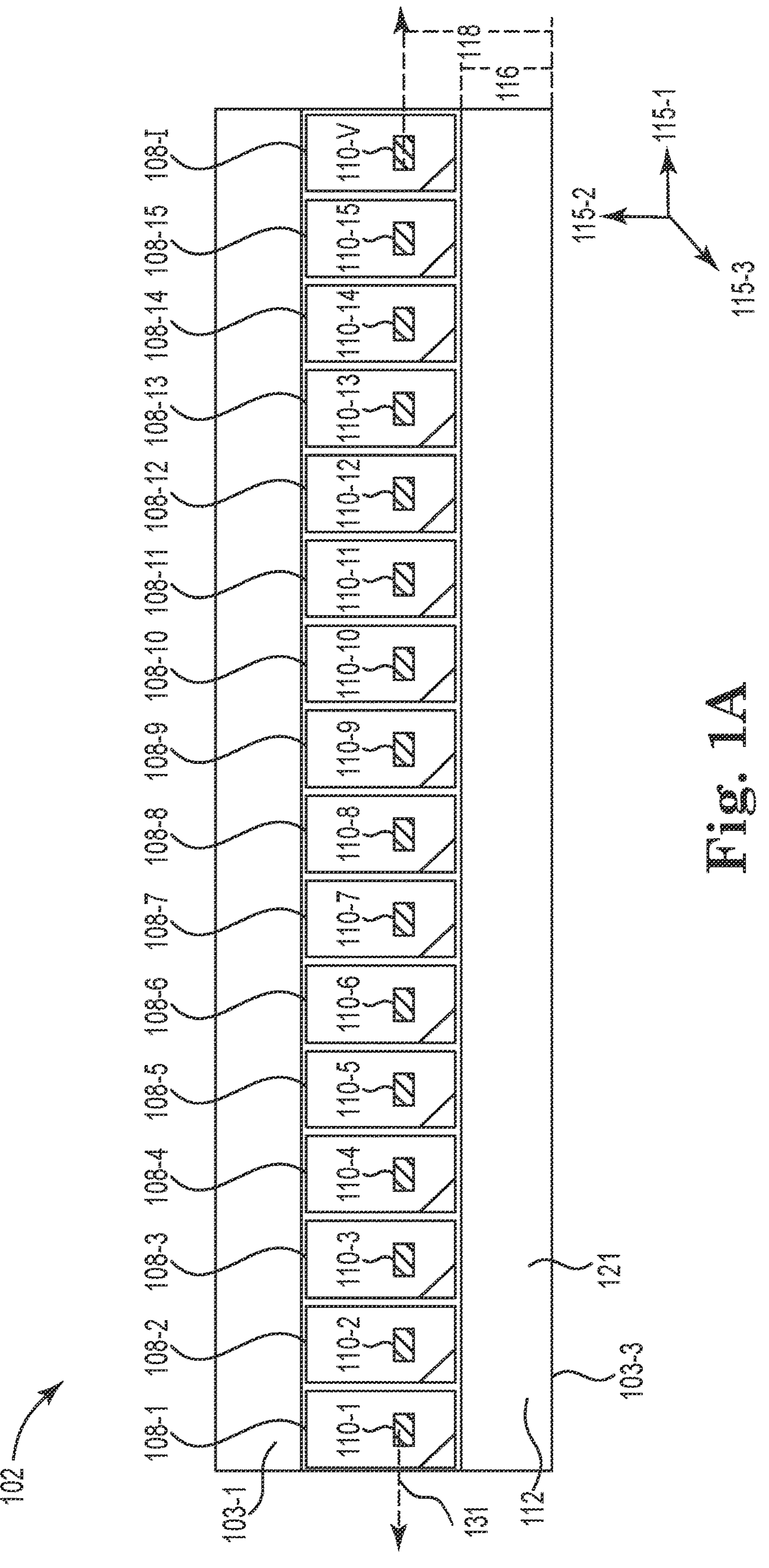
FIG. 1A illustrates an example of a portion of an I/O cell arrangement in a die or chip configured for selectable packaging types in accordance with some embodiments of the present disclosure.

Aspects of the present disclosure are directed to integrated circuits with selectable packaging types (e.g., selectable package bonding types). Wirebond and flip-chip are two different types of integrated circuit (IC) packaging technologies. Packaging or assembly technologies in electronics generally refers to methods by which structure and interconnects may be formed between a die (e.g., a logic die) and a package.

As used herein, a die or dies refer to logic dies, memory dies, or a combination of logic dies and memory dies. As used herein, a package refers to any semiconductor package to which a die may be bonded to form an integrated circuit (IC). The resultant IC may be bonded to a motherboard such as a printed circuit board (PCB) to form a portion of a memory device. For instance, input/output (I/O) pins located on a face (e.g., a non-active face) of the package may be bonded to a PCB to form a portion of a memory device.

As used herein, wirebond or wirebonding refers to a packaging technology where an active area of a die "faces up" and is attached to the package via bond wires. For instance, fine wires may arch from I/O cells to packages. The bond wires may be routed outside the edges of the die. Bond wires may be formed of various metals and/or conductors such as gold, silver, aluminum, and/or copper. The bond wires may be bonded (e.g., bonded to the I/O cells) via thermosonic bonding (using localized heat created by ultrasonic vibrations), tape automated bonding (TAB), and/or other methods of bonding. Wirebonding may be relatively cost-effective.

As used herein, flip-chip or flip-chip bonding refers to a packaging technique where the active area of the chip or die is "flipped over" such that the chip or die "faces down". Unlike wirebonding that employs bond wires routed outside edges of the die, any portion of the face of the active area of the die can be used for flip-chip interconnections. Flip-chip interconnections (e.g., pillars, bumps, or balls) can be formed of metal bumps of solder, copper, nickel, and/or gold, etc. The flip-chip interconnections may be soldered or otherwise formed. Flip-chip bonding may permit a large number of interconnects (e.g., due to permitting any portion of the face of the active area of the die to be used for flip-chip interconnections) which span a relatively shorter distance as compared to bond wires. However, flip-chip bonding may be more costly than wirebonding.

Typically, a type of packaging technique for an integrated circuit is designated at an initial design phase of a given IC. For example, a type of packaging technique for a die employed in a given application specific integrated circuit (ASIC) may be selected at an initial design stage and subsequently other aspects of the ASIC (e.g., die size, size aspect ratio, I/O cell placement location and/or type of I/O cells and/or package pins) may be optimally designed based on the selected particular packaging technique.

For instance, an IC or ASIC designed for flip-chip bonding typically has a higher quantity of I/O cells and/or package pins and thus may have various I/O cells and/or package pins centrally located (e.g., located proximate to a center of the IC or ASIC). Conversely, an IC or ASIC initially designed for wirebonding may have I/O cells and/or package pins that are exclusively (only) located on a periphery of an IC or ASIC. Having the I/O cells and/or package pins located exclusively on the periphery of the IC or ASIC may permit wirebond formation and/or avoid interference (e.g., electrical shorts) between wirebonds. As a result, the type of packaging technique (e.g., wirebonding or chip-flip) in such approaches may not be later altered without significantly impacting function, size, and/or configuration of the IC or ASIC.

Typically, wirebonding can be employed for ICs which utilize relatively low operational frequencies and/or a relatively low quantity of interconnects (e.g., I/O cells and/or package pins). However, as operational signal frequency increases (e.g., at ~150 kilohertz) and/or a quantity of interconnects increases, wirebonding may not be suitable. For instance, at higher operational frequencies and/or higher quantities of interconnected bond wires, operation of the chip and/or IC may be impacted by parasitics (e.g., resistance, inductance, capacitance etc.).

Flip-chip bonding can be employed at higher operational frequencies and/or with higher quantities of interconnects in comparison to, for example, wirebonding, but as mentioned may be more costly than wirebonding. An exact operational frequency and/or quantity of interconnects at which a shift in package type from wirebonding to flip-chip is desirable may depend on factors including a quantity of chips to be manufactured and/or may vary over time (e.g., may change after an initial design phase of a given IC).

Embodiments of the present disclosure address the above-noted and other deficiencies by implementing ICs with selectable packaging types during the design cycle. For instance, ICs with selectable packaging types in accordance with aspects of the disclosure can have I/O cells that are configured to be selectively bonded via wirebonded interconnections or flip-chip bonded interconnections to a package. In accordance with aspects of the present disclosure, approaches herein configure the placement of I/O pad cells in a particular arrangement and at a common pitch of the selectable package types. As used herein, a "common pitch" refers to a configuration of the I/O cells on a given die or chip such that the I/O cells can accommodate being selectively bonded to a package via either first packaging type at a first pitch or second packaging type at a second pitch that is different (typically larger) than the first pitch.

Accordingly, approaches herein employ I/O cells configured to accommodate the same quantity of interconnections at different respective pitches for wirebond interconnections (e.g., wirebonds substantially at a 55 μm in-line pitch) or flip-chip interconnections (e.g., a flip-chip interconnections substantially at a 110 μm staggered pitch) for a given die or chp size, as described herein. Therefore, advantages of the systems and methods implemented in accordance with some embodiments of the present disclosure include, but are not limited to, permitting selection of wirebond interconnections or flip-chip interconnections depending upon various considerations later in the development cycle of an IC (e.g., at a time of closing & delivering the design for manufacturing of an IC) rather than being constrained to an individual packaging technique (e.g., wirebonding or flip-chip) that the IC was originally designed for. These and other aspects of the present disclosure therefore permits design of an IC that can be easily configured for either of the package types during any time in the development phase without changing other aspects of the ASIC.

FIG. 1A illustrates an example of portion of an I/O cell arrangement in a die (or chip) 102 configured for selectable packaging types in accordance with some embodiments of the present disclosure. In some embodiments, the portion of die 102 can be included in a system or IC such as the IC 106 described in FIG. 1B or the IC 107 described in FIG. 1C. In some embodiments, the IC can be an application specific integrated circuit (ASIC). For instance, the ASIC can include particular circuitry (e.g., a power inverter) that is designed for a specific application in a memory device or other device.

The die 102 may be a logic die or a memory die. For instance, the die 102 may be a logic die. A logic die may comprise a semiconductor wafer that comprises a plurality of active semiconductor die. The semiconductor die may, for example, comprise a processor die, memory die, programmable logic die, application specific integrated circuit die, field-programmable gate array die, general logic die, etc. The die 102 may be formed with various stacked materials (e.g., CMOS layers and/or a redistribution layer) and/or various IC packaging techniques known in the art.

Figure 1B:
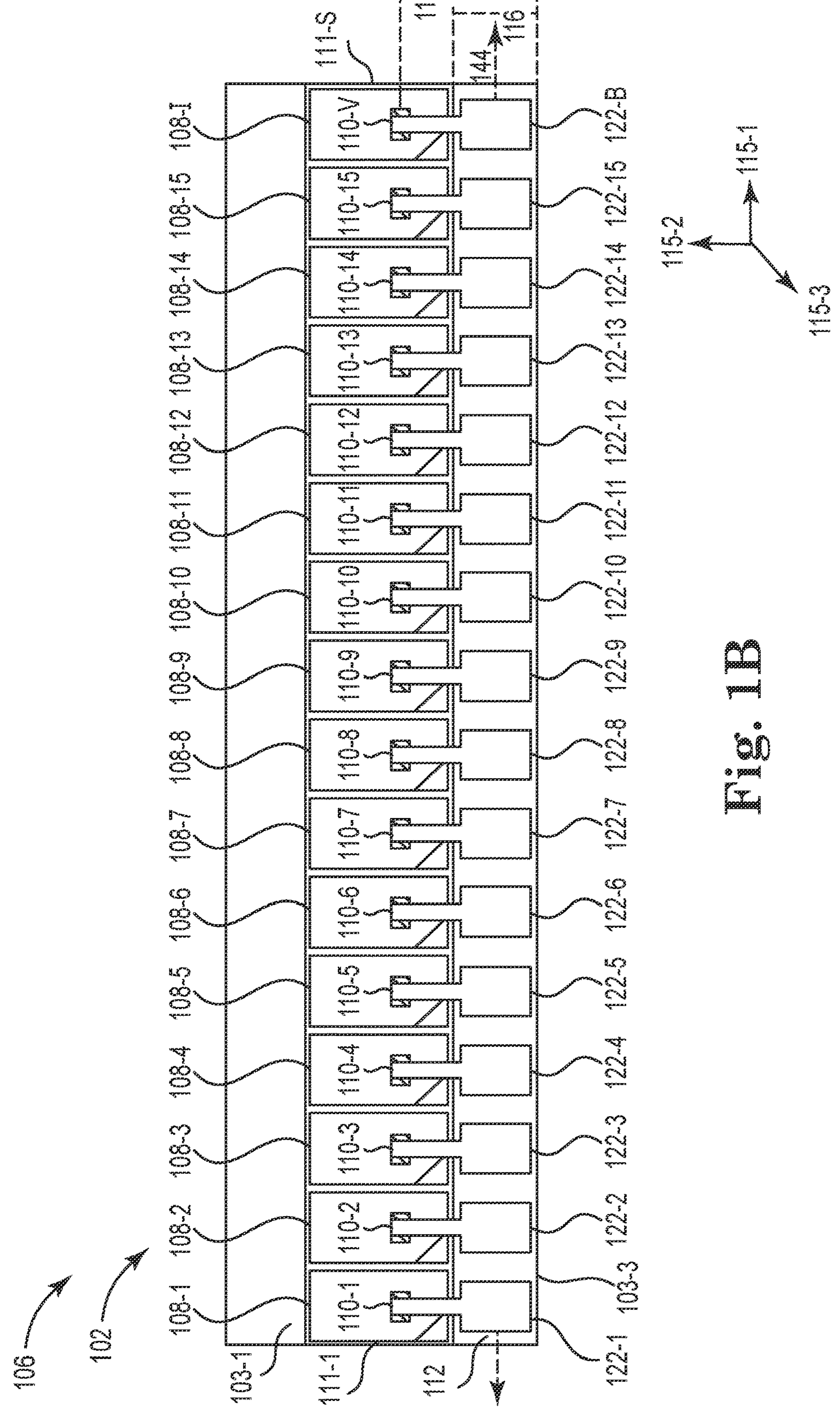
FIG. 1B illustrates an example of an integrated circuit including a die or chip with an I/O cell arrangement configured with a first packaging type in accordance with some embodiments of the present disclosure.
Figure 1C:
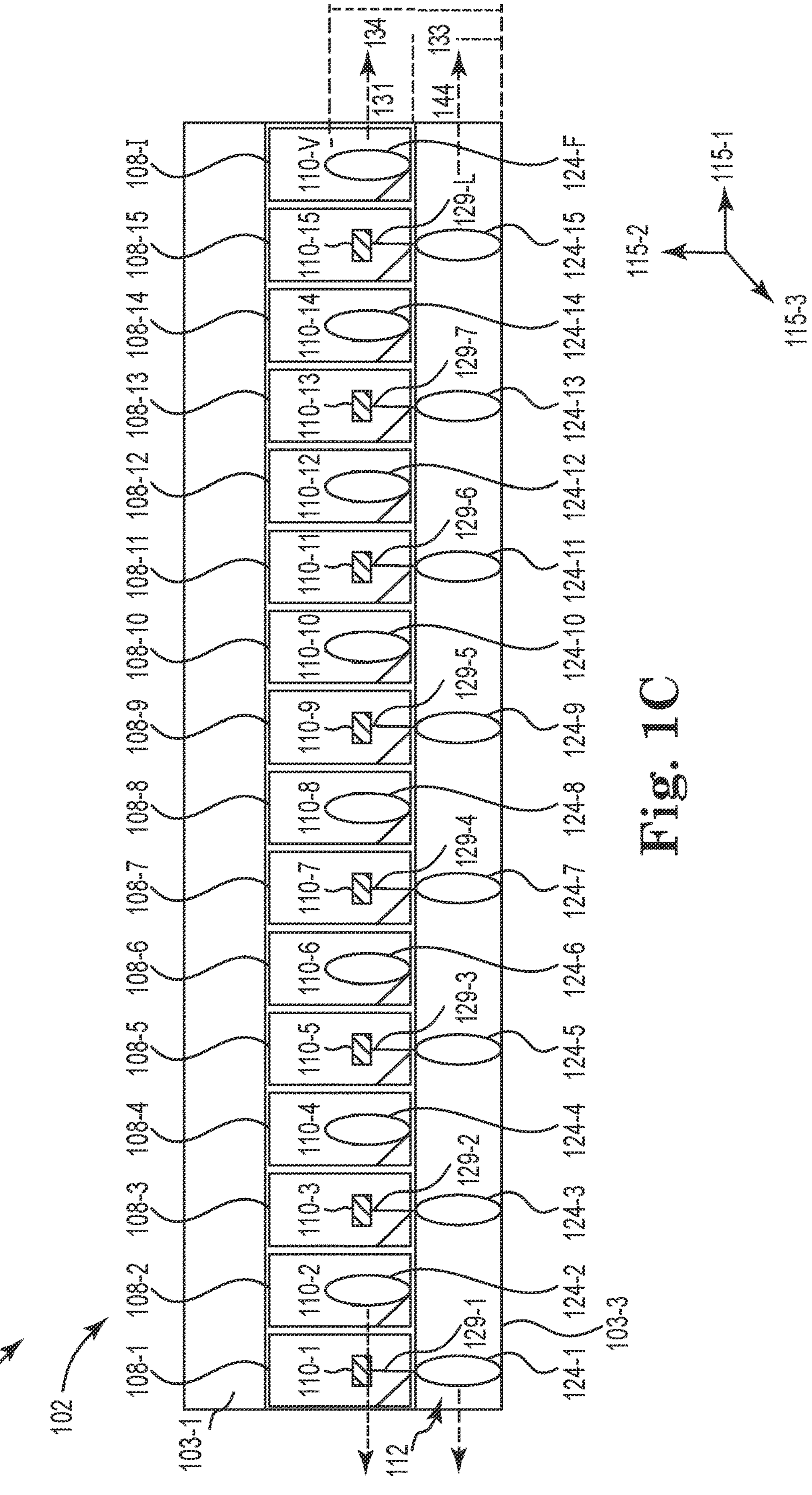
FIG. 1C illustrates another example of an integrated circuit including a die or chip with an I/O cell arrangement configured with a second packaging type in accordance with some embodiments of the present disclosure.

The die 102 can have a plurality of faces including a first face 103-1, a second face (not shown in FIG. 1A) that is opposite the first face 103-1, and a third face 103-3 that is located between the first face 103-1 and the second face. In some embodiments, the first face 103-1 can be a top face, the second face can be a bottom face that is opposite the top face, and the third face 103-3 can be a side face that is located between the top face and the bottom face. In some embodiments, the top face 103-1 can be an active face (active surface) having various circuitry such as I/O cells, etc., as illustrated in FIGS. 1A, 1B & 1C.

The die 102 may include at least one cavity, hole or void that extends through the die 102. The void in the dies may permit interconnections from a face of the IC to the other side of the die through the voids. For instance, the die 102 may include routing vias (RV) such as through silicon vias (TSVs) that connect a face of the IC (e.g., package pins on a bottom face of a package) to I/O cells on the die 102.

Figure 2A:
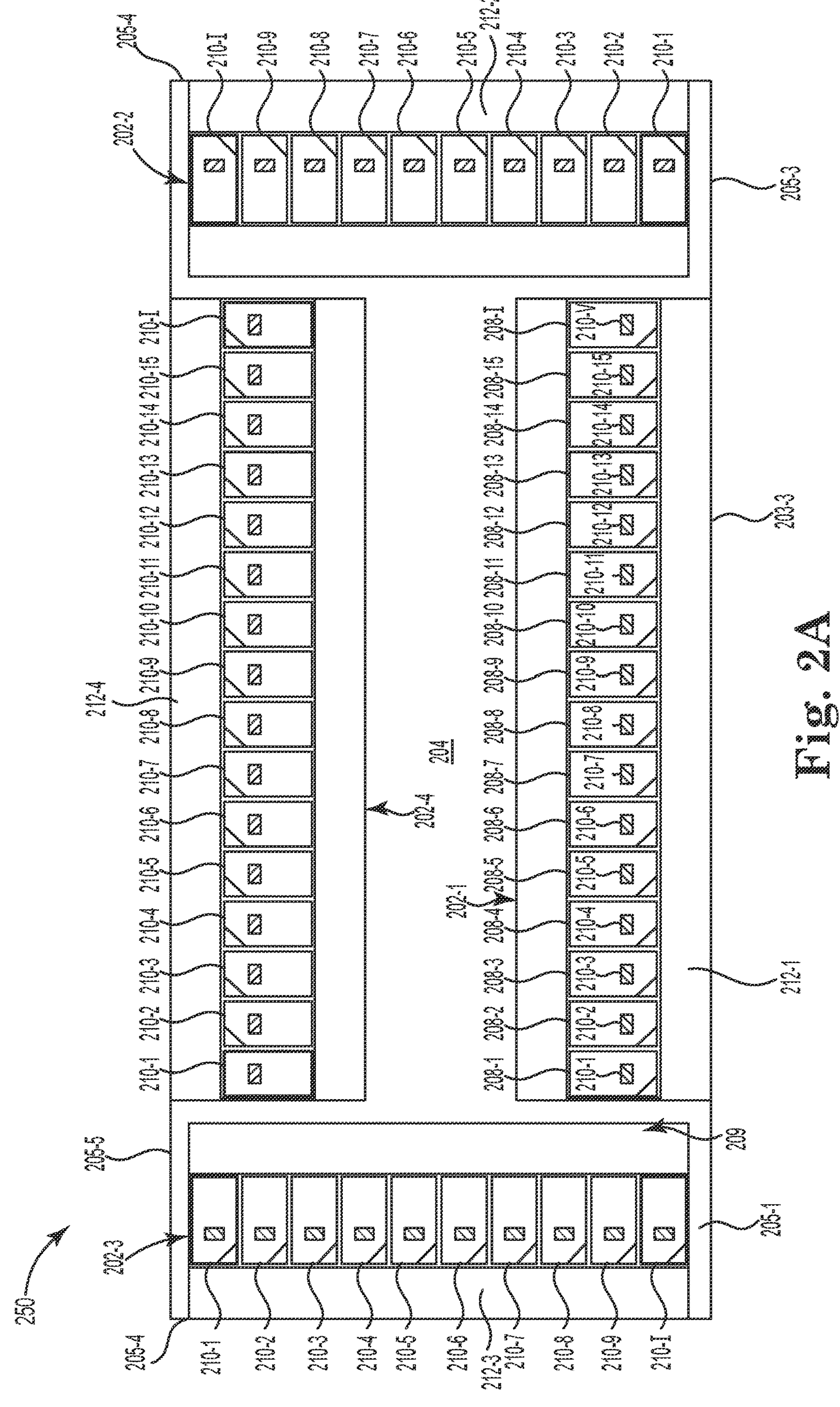
FIG. 2A illustrates another example of an integrated circuit including I/O cells forming an I/O ring configured for selectable packaging types in accordance with some embodiments of the present disclosure.
Figure 2B:
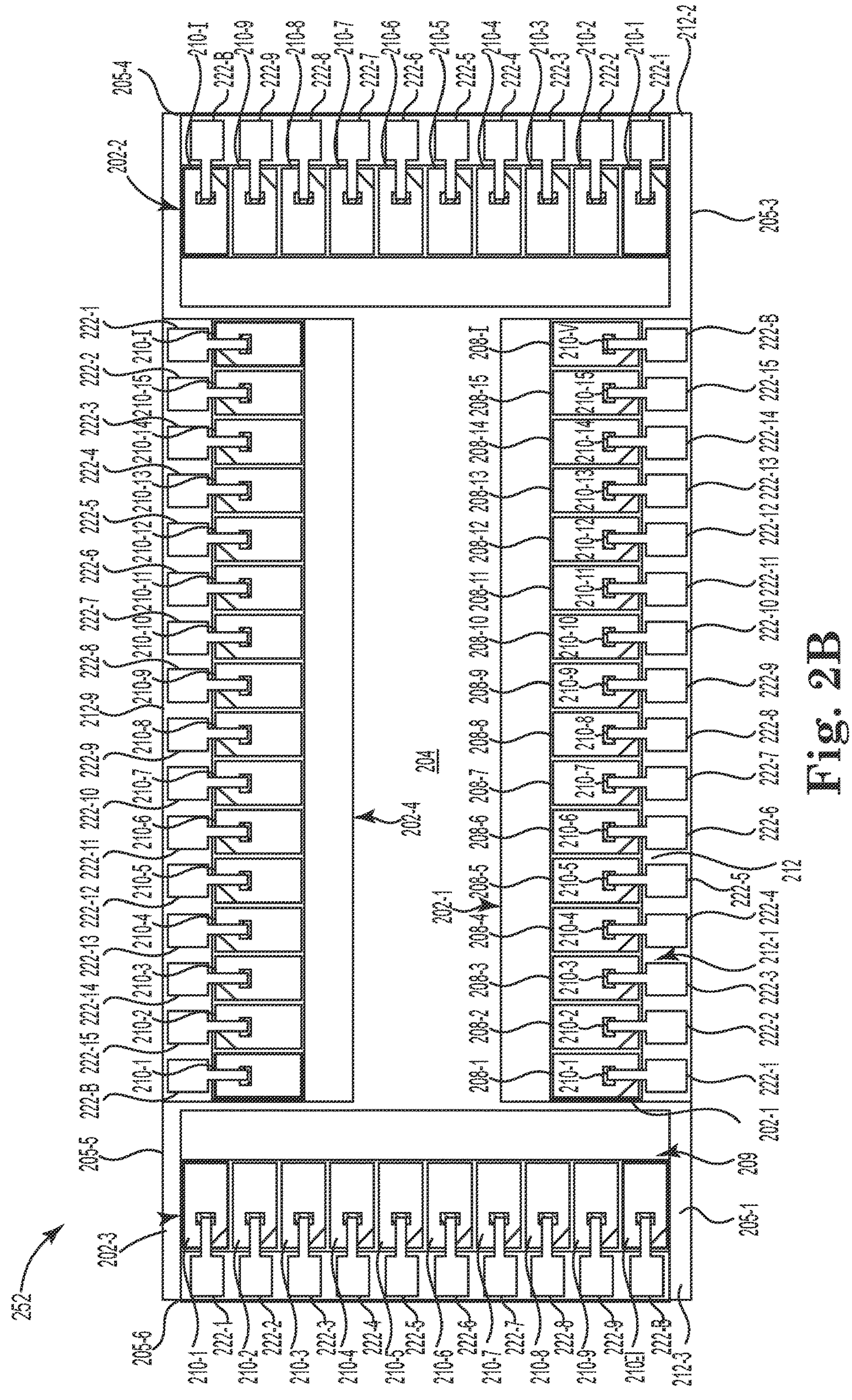
FIG. 2B illustrates another example of an integrated circuit including I/O cells forming an I/O ring configured with a first packaging type in accordance with some embodiments of the present disclosure.
Figure 2C:
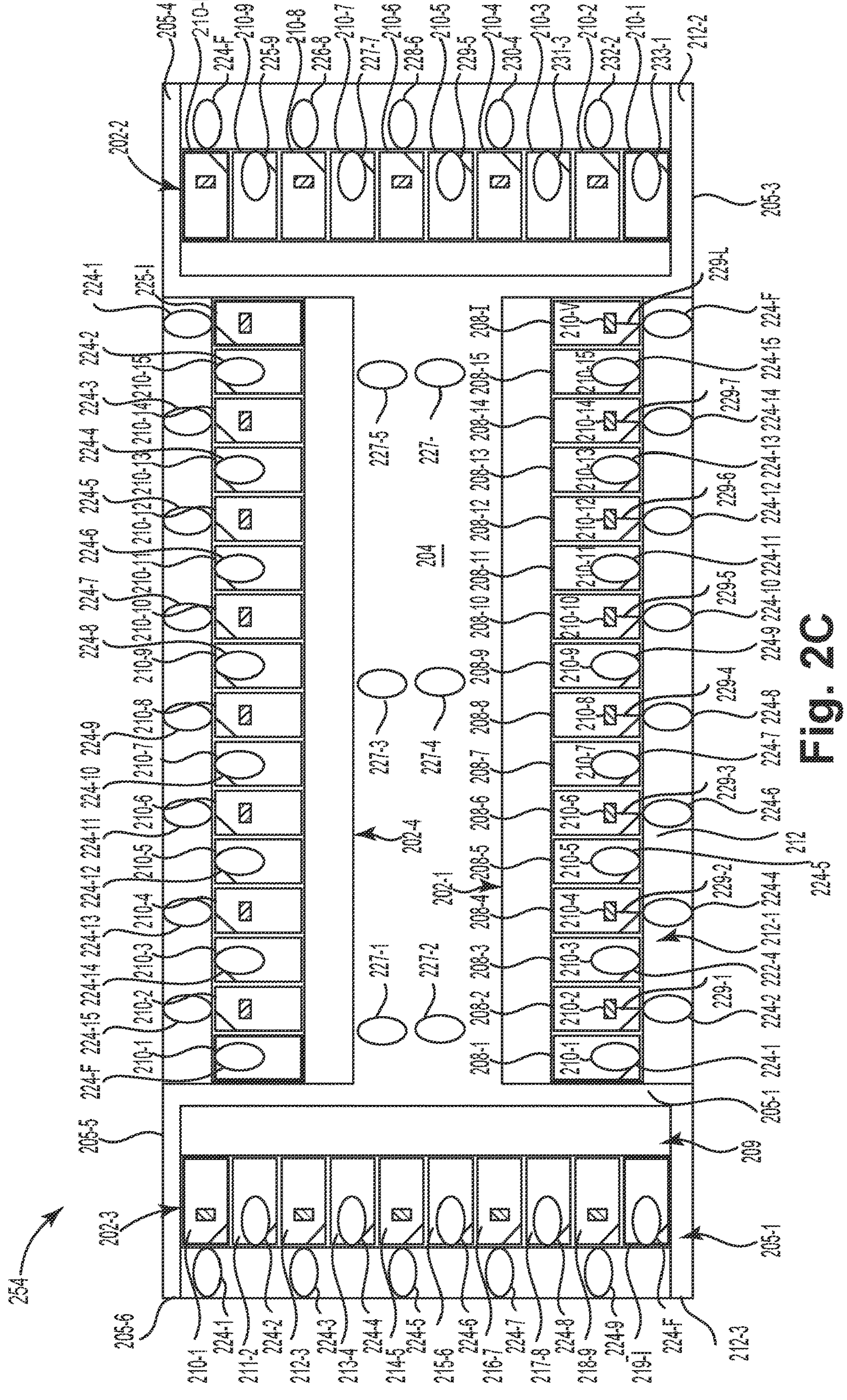
FIG. 2C illustrates another example of an integrated circuit including I/O cells forming an I/O ring configured with a second packaging type in accordance with some embodiments of the present disclosure.

The I/O cells 108 may be configured to permit interconnection to be formed between the die 102 and circuitry such as a package, as described herein. As illustrated in FIG. 1A, I/O cells such as a first I/O cell 108-1, a second I/O cell 108-2, a third I/O cell 108-3, a fourth I/O cell 108-4, a fifth I/O cell 108-5, a six I/O cell 108-6, a seventh I/O cell 108-7, an eighth I/O cell 108-8, a ninth I/O cell 108-9, a tenth I/O cell 108-10, an eleventh I/O cell 108-11, a twelfth I/O cell 108-12, a thirteenth I/O cell 108-13, a fourteenth I/O cell 108-14, a fifteenth I/O cell 108-15, . . . , $I^{th}$ I/O cell 108-I (collectively referred to herein as I/O cells 108) may be coupled to the first face 103-1 of the die 102 using either wirebonds or flip-chip bonds. While a given quantity of I/O cells are illustrated in FIG. 1A the quantity of I/O cells may be varied. In various embodiments, the I/O cells 108 can form an I/O ring (e.g., as detailed herein in FIG. 2A-2C) that is configured to be selectively bonded to the package by interconnections formed at a common pitch that is equivalent to a first pitch of a first packaging type (e.g., wirebonding) and a second pitch of a second package type (e.g., flip-chip bonding). The I/O cells 108 and similarly the I/O ring (e.g., I/O ring 209 as illustrated in FIG. 2A-2C) can be configured to be selectively bonded (via wirebonding or flip-chip bonding) due at least due to having the I/O cells 108 (e.g . . . , each of the I/O cells included in an I/O ring) be the same shape, same size, located along a common axis, spaced a distance (e.g., a same distance) from an side face of the die 102, having respective RV coupled thereto, and/or having a top face of the decoupling capacitor area be coplanar with a top face of each of the I/O cells 108, etc. As mentioned, having the I/O ring configured as described herein may permit selection of wirebond interconnections or flip-chip interconnections, for instance, depending upon various considerations later in the development cycle of an IC (e.g., at a time of delivering the design for manufacturing of an IC) rather than being constrained to a given predetermined packaging technique (e.g., wirebonding and/or flip-chip) that the IC was originally designed for.

In some embodiments, the quantity of I/O cells 108 in a given die may be an even number such as a total of 16, 12, 10, or 8 I/O cells in a given die, among other possible values. Having the quantity of I/O cells 108 be an even number can promote aspects herein such as configuring the I/O cells to be selectively bonded to the package by interconnections formed at a common pitch that is equivalent to a first pitch of a first packaging type and a second pitch of a second package type, etc. However, in some embodiments, the quantity of I/O cells 108 in a given die may be an odd number such as 17, 15, 13, 11, 9, or 7 I/O cells in the given die, among other possible values. In some embodiments each I/O cell 108 may be the same shape (e.g., having a substantially rectangular top face) and same size, as illustrated in FIG. 1A. Similarly, each I/O cell 108 may be configured in the same orientation (e.g., as indicated by the triangle located in the same corner/respective location in each of the I/O cells) in a given die. For instance, each of the triangles indicating the respective orientation of the I/O cells can be located in a bottom left corner of the I/O cells, as illustrated in FIG. 1A. However, in some embodiments, each of the I/O cells can be in a different orientation (e.g., flipped 180 degrees about the axis 115-2), for instance such that each of the triangles indicating the respective orientation of the I/O cells can be located in a bottom right corner of the I/O cells, among other possibilities.

In some embodiments, each RV (e.g., I/O pin) 110 of I/O cell 108 may be coupled to the first face 103-1 of the die 102 along a common axis. For instance, as illustrated in FIG. 1A each RV can be coupled to the first face 103-1 of the die 102 along a common axis such as the second axis 131 extending in a first direction 115-1. That is, the RV on a given die may be coupled to a first face of the die along a common axis extending in a first direction 115-1 or a second direction 115-2, as described in greater detail herein with respect to FIG. 2A. For instance, the first direction 115-1 may lie in the same plane and be normal to (90 degree different than) the second direction 115-2, as illustrated in FIG. 1A.

In some embodiments, I/O ring 108 may be spaced a distance 116 from a third (side) face 103-3 of the die 102. For instance, I/O ring 108 may be spaced the same distance (e.g., distance 116) from the side face 103-3 of the die 102, as illustrated in FIG. 1A. Having I/O ring 108 spaced the same distance 116 from the side face 103-3 of the die 102 can promote aspects herein such as permitting non-critical circuitry such as decoupling capacitors (decap) to be positioned in and/or under a bond area 112. In various embodiments, the bond area 112 can be sized to permit the presence of a particular type of interconnection such as a wirebond (e.g., wirebonded interconnections 122) or a flip-chip bond (flip-chip interconnections 124) to be formed thereon, as detailed herein for instance, in FIG. 1B.

In some embodiments, a top face 121 of the bond area 112 can be coplanar with a top face of each of the I/O cells 108. For instance, the top face 121 of the bond area 112 can be coplanar (along the first direction 115-1 and the second direction 115-2) with a top face 111-1 of the first I/O cell 108-1 and a top face 111-S of the I$^{th}$ I/O cell 108-I. The top face of the I/O cell refers to an exposed face of a I/O cell that is located in, coplanar with, or extends a distance above the top face of the die 102. That is, the top face of the I/O cell can be configured to have interconnections formed thereon. Having the top face 121 of the bond area 112 be coplanar with the top faces of each of the I/O cells 108 can promote aspects therein such permitting formation of wirebond (wirebonded) interconnections 122 or flip-chip interconnections 124 on a top face 121 of the bond area 112, as described herein in greater detail in FIG. 1B and FIG. 1C.

In some embodiments, critical circuitry such as controller and/or other critical circuitry such as an inverter can be absent from the area located under (located under in a third (vertical) direction 115-3) the bond area 112. Having the bond area 112 be free of critical circuitry can ensure that the critical circuitry is not damage or otherwise impacted due to the formation of interconnects such as wirebonded interconnections which are formed at least partially on the bond area 112. For example, if present under the bond area 112, the critical circuitry may experience pressure, vibrations, etc. associated with formation of wirebonded interconnects that may damage the critical circuitry. In some embodiments, the decoupling capacitor circuitry can be located underneath the bond area.

In some embodiments, the die 102 includes a plurality of routing vias (RV). For instance, the die 102 can include RV such as a first RV 110-1, a second RV 110-2, a third RV 110-3, a fourth RV 110-4, a fifth RV 110-5, a sixth RV 110-6, a seventh RV 110-7, an eighth RV 110-8, a ninth RV 110-9, a tenth RV 110-10, an eleventh RV 110-11, a twelfth RV 110-12, a thirteenth RV 110-13, a fourteenth RV 110-14, a fifteenth RV 110-15, . . . , V$^{th}$ RV 110-V (collectively referred to herein as RV 110). Each of the I/O cells 108 can have respective RV extending therethrough, as illustrated in FIG. 1A.

A quantity of the RV 110 can be at least equal to a quantity of the I/O cells 108. For instance, the quantity of RV in a given die can be an equal to a quantity of I/O cells 108 in the given die, among other possibilities. In some embodiments, each of the RV 110 on a given die can be spaced a distance away from the a side face of the die. For instance, each of the RV 110 can be spaced a same distance such as a distance 118 away from the third (side) face of the die 102.

FIG. 1B illustrates an example of an IC 106 including a die (or chip) with an I/O cell arrangement configured with a first packaging type in accordance with some embodiments of the present disclosure. The IC 106 can include a die 102. The die 102 illustrated in FIG. 1B is the same as the die 102 in FIG. 1A, but with the addition of wirebonded interconnections (e.g., bond wires) that couple the die 102 to a package (not illustrated in FIG. 1B).

For instance, the IC 106 of FIG. 1B, may include a first wirebonded interconnection 122-1, a second wirebonded interconnection 122-2, a third wirebonded interconnection 122-3, a fourth wirebonded interconnection 122-4, a fifth wirebonded interconnection 122-5, a sixth wirebonded interconnection 122-6, a seventh wirebonded interconnection 122-7, an eighth wirebonded interconnection 122-8, a ninth wirebonded interconnection 122-9, a tenth wirebonded interconnection 122-10, an eleventh wirebonded interconnection 122-11, a twelfth wirebonded interconnection, a thirteenth wirebonded interconnection 122-13, a fourteenth wirebonded interconnection, a fifteenth wirebonded interconnection 122-15, . . . , a B$^{th}$ wirebonded interconnection (collectively referred to herein as wirebonded interconnections 122). The wirebonded interconnections can couple the die 102 to a package.

As illustrated in FIG. 1B, a quantity of wirebonded interconnection can be equal to a quality of the I/O cells 108. That is, each of the I/O cells 108 can have a respective wirebonded interconnection extending from a respective RV 110 in each of the I/O cells 108 to a package to electrically couple the I/O cells via the RV 110 to the package, as described herein in greater detail in FIG. 3.

The wirebonded interconnections 122 can be in-line wirebonded interconnections. As used herein, in-line wirebonded interconnections refer to wirebonded interconnections (bond wires) that are each formed along a common axis. For instance, each of the wirebonded interconnections 122 can be formed along a common axis 144 extending in a first direction 115-1 through each of the wirebonded interconnections, as illustrated in FIG. 1B.

Each of the wirebonded interconnections 122 can be routed in substantially the same direction. For instance, as illustrated in FIG. 1B, each of the wirebonded interconnections 122 can be routed in substantially the second direction 115-2. As illustrated in FIG. 1B, each of the wirebonded interconnections can be substantially the same length (e.g., a length extending in the second direction 115-2), for instance due to the RV 110 and/or I/O cell 108 being the same respective distances from the third face 103-3 of the die 102. Each of the wirebonded interconnections 122 be formed of a bond wire such as an aluminum bond wire, among other possible types of bond wires.

FIG. 1C illustrates another example of an IC 107 including a die (or chip) with a I/O arrangement configured with a second packaging type in accordance with some embodiments of the present disclosure. The IC 107 can include a die 102. Thus, the die 102 illustrated in FIG. 1C is the same as the die 102 in FIG. 1A, but with flip-chip interconnections (e.g., pillars) that couple the die 102 to a package (not illustrated in FIG. 1B).

For instance, the IC 107 of FIG. 1C, may include a first flip-chip interconnection 124-1, a second flip-chip interconnection 124-2, a third flip-chip interconnection 124-3, a fourth wirebonded interconnection 124-4, a fifth flip-chip interconnection 124-5, a sixth flip-chip interconnection 124-6, a seventh flip-chip interconnection 124-7, an eighth flip-chip interconnection 124-8, a ninth flip-chip interconnection 124-9, a tenth flip-chip interconnection 124-10, an eleventh flip-chip interconnection 124-11, a twelfth flip-chip interconnection 124-12, a thirteenth flip-chip interconnection 124-13, a fourteenth flip-chip interconnection 124-14, a fifteenth flip-chip interconnection 124-15, . . . , a $F^{th}$ flip-chip interconnection 124-F (collectively referred to herein as flip-chip interconnections 124). The flip-chip interconnections 124 can couple the die 102 to a package.

As illustrated in FIG. 1C, flip-chip interconnection 124 can be equal to a quantity of the I/O cells 108. The flip-chip interconnections 124 can be staggered flip-chip interconnections as illustrated in FIG. 1C. For instance, the flip-chip interconnections 124 can include a first subset of the flip-chip interconnections 124 that are located along a first axis 144 located a first distance 133 from the third face 103-3 of the die 102 and a second subset of the flip-chip interconnections that are located along a second axis 131 which is a second distance 134 from the third face 103-3 of the die 102. That second distance 134 may be greater than the first distance 133. That is, as illustrated in FIG. 1C, the first axis 144 and the second axis 131 can extend in the same direction (e.g., along a first direction 115-1) but be offset a distance from each other. As described in greater detail in FIG. 2C, the flip-chip interconnections 124 can be coupled to the RV 110 directly or indirectly. For instance, some of the flip-chip interconnections 124 can be coupled to the RV 110 indirectly via leads 129-1, 129-2, 129-3, 129-4, 129-5, 129-6, 129-7, and 129-L as described in greater detail in FIG. 2C.

The first axis 144 can be located along the bond area 112, whereas the second axis 131 can be located along the I/O cells 108, as illustrated in FIG. 1C. Thus, half of the flip-chip interconnections 124 can be located along the first axis 144 in the bond area 112 while the other half of the flip-chip interconnection can be located along the second axis 131 on some of the I/O cells 108. For instance, the flip-chip interconnections 124 can alternate between being located along the first axis and being located along the second axis 131 as illustrated in FIG. 1C. Staggering the flip-chip interconnection 124 (e.g., in the every other fashion illustrated in FIG. 1C) can permit the same quantity of flip-chip interconnections to be employed (e.g., equal to a quantity of wirebonded interconnections in FIG. 1B) by accommodating the larger size of the flip-chip interconnections 124 that may otherwise prohibit the same quantity of flip-chip interconnections to be employed in an in-line manner (e.g., having each of the flip-chip interconnections present along the same axis).

The die 102 and the resultant IC (e.g., the IC 106 as illustrated in FIG. 1B and/or the IC 107 as illustrated in FIG. 1C) can be included in a memory sub-system in a computing system. The memory sub-system can include media, such as one or more volatile memory devices, one or more non-volatile memory devices, or a combination of such. The volatile memory devices can be, but are not limited to, random access memory (RAM), such as dynamic random access memory (DRAM) and synchronous dynamic random access memory (SDRAM). Some examples of non-volatile memory devices include negative-and (NAND) type flash memory and write-in-place memory, such as three-dimensional cross-point ("3D cross-point") memory device, which is a cross-point array of non-volatile memory cells. Although non-volatile memory components such as three-dimensional cross-point arrays of non-volatile memory cells and NAND type memory (e.g., 1D NAND, 3D NAND) are described, the memory device can be based on any other type of non-volatile memory or storage device, such as such as, read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system can be a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

As used herein, an "apparatus" can refer to various structural components. For example, the components illustrated in any one or more of FIGS. 1A-1C, FIGS. 2A-2C, and/or FIG. 3 can be considered an apparatus.

Figure 1D:
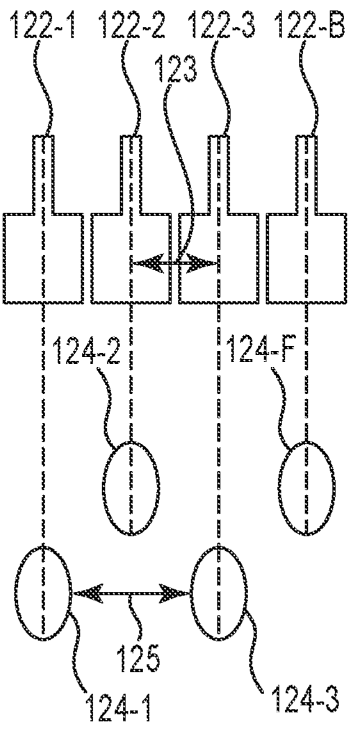
FIG. 1D illustrates an example of an apparatus suitable for forming an integrated circuit including an die or chip with I/O cells configured for selectable packaging types in accordance with some embodiments of the present disclosure.

FIG. 1D illustrates an example of an apparatus suitable for forming an integrated circuit including a die (or chip) with I/O cells configured for selectable packaging types in accordance with some embodiments of the present disclosure. The I/O cells, as described in FIG. 1B and FIG. 1C can be selectively bonded via either wirebonded interconnections at a first pitch 123 or flip-chip interconnections at a second pitch 125.

Accordingly, the I/O cells as described herein can be configured at a common pitch or common pitch ratio to permit interconnection to be formed with either wirebonded interconnection (e.g., in-line wirebonded interconnections) or flip-chip interconnection (e.g., staggered flip-chip interconnections). In some embodiments, the second pitch 125 can be larger than the first pitch 123. For instance, the I/O cells can be configured at a common pitch such that the second pitch 125 may be two times larger (twice) the first pitch 123. As illustrated in FIG. 1D, the pitch of successive (adjacent) flip-chip interconnections located along the same axis (e.g., the second axis 131) can be spaced a distance that is twice the distance of successive (adjacent) wirebonds located along the same axis (the second axis 131). For example, the first pitch 123 may be substantially equal to 55 micrometers (μm) and the second pitch may be substantially equal to 110 μm, among other possibilities. As used herein, the term "substantially" intends that the characteristic need not be absolute but is close enough so as to achieve the advantages of the characteristic. For example, "substantially" at a given pitch is not limited to a condition in which the pitch is an exact value but can be within a range that is +/−10% of the exact value within manufacturing limitations, operational conditions, etc. to achieve the characteristics of being "substantially" at the given pitch. For example, if the first pitch is substantially equal to 55 micrometers then the first pitch can be within +/−10% of a 55 micrometer pitch.

FIG. 2A illustrates another example of an IC 250 including I/O cells forming an I/O ring configured for selectable packaging types in accordance with some embodiments of the present disclosure. The IC 250 can include I/O cells such as a first I/O group (e.g., a first die) 202-1, a second I/O group (e.g., a second die) 202-2, a third I/O group (e.g., a third die) 202-3, and a fourth I/O group (e.g., a fourth die) 202-4 (collectively referred to herein as dies 202 or I/O ring 209). Each of the I/O groups (e.g., dies) 202 in FIG. 2A can be analogous to the die 102 described in FIG. 1A. As illustrated in FIG. 2A, each of the I/O group 202 can be positioned at a respective location around a periphery of a package 204 to permit the I/O cells to be selectively coupled to the package 204 via wirebonded interconnections (wirebonds) as described in FIG. 2B or via flip-chip interconnections (flip-chip bonds) as described in FIG. 2C.

Figure 3:
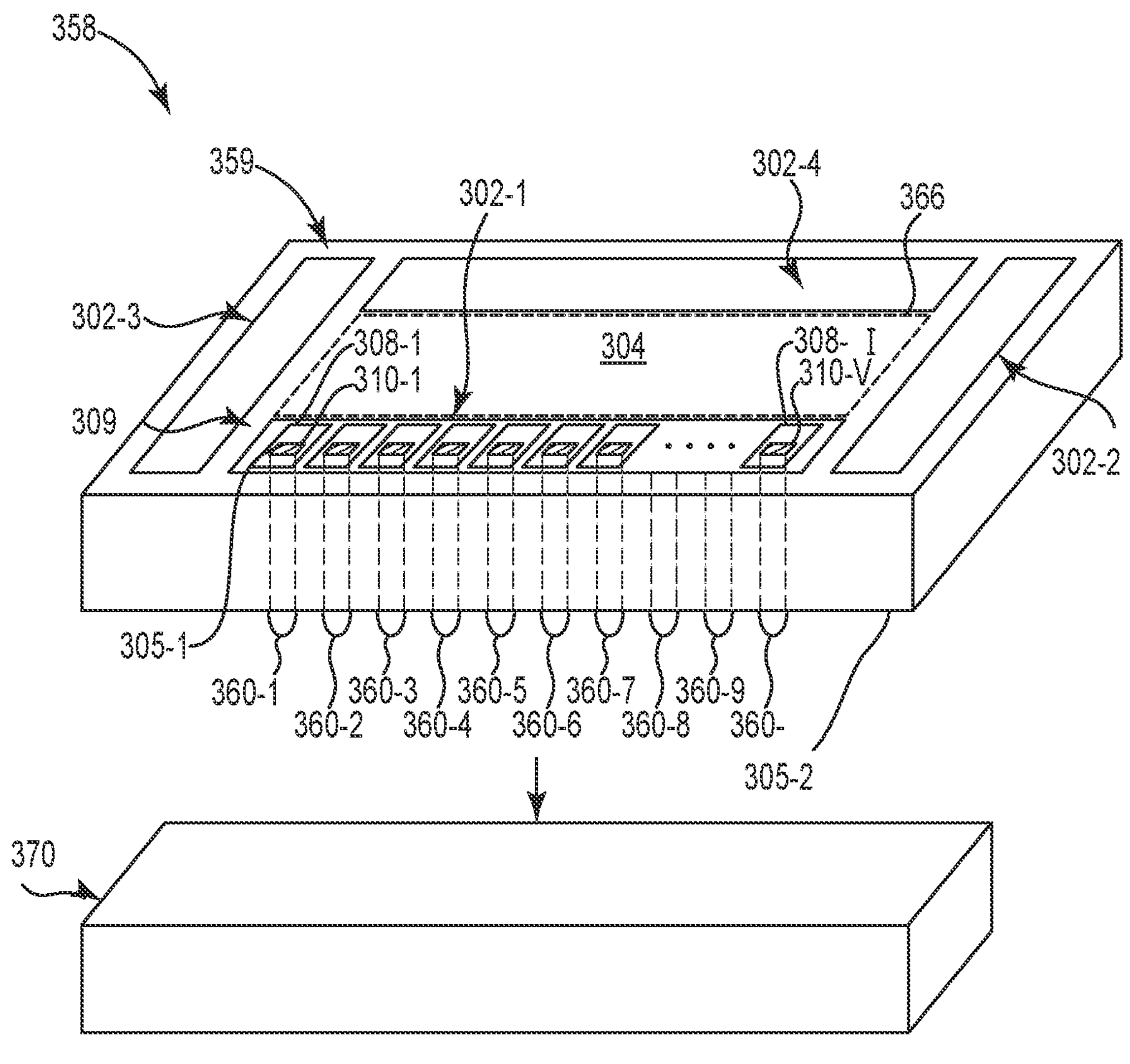
FIG. 3 illustrates an example of apparatus including an integrated circuit including dies or chips with an I/O ring configured for selectable packaging types in accordance with some embodiments of the present disclosure.

As illustrated in FIG. 2A, each I/O cell 208 of the I/O group 202 may be located around the periphery of the package 204. As used herein being located around a periphery of a package refers to a face of a die being located in contact with or near a side face such as side face 205-3, 205-4, 205-5, or 205-6 of the package 204 that is between a top face 205-1 and a bottom face (e.g., bottom face 305-2 as illustrated in FIG. 3) of the package 204. For instance, a third (side) face 203-3 may be located at a third (side) face 205-3 of the package 204. Stated differently, a side face (e.g., a third face 203-3) of the die 202 may be coplanar with a side face of the package 204 along the third (vertical) direction (e.g., direction 115-3 as illustrated in FIG. 1). Similarly, each of the other I/O groups may be located at a different side face of the package 204, as illustrated in FIG. 2A. Having the I/O cells located around the periphery of the package 204 can promote aspects herein such as permitting the I/O cells on the dies to be selectively bonded via either wirebond interconnections (wirebonds) or flip-chip interconnections (flip-chip bonds) to the package 204. For instance, the first I/O group 202-1, a second I/O group 202-2, a third I/O group 202-3, and a fourth I/O group 202-4 can together form an I/O ring 209 that is amenable to being selectively coupled to the package 204 via wirebonded interconnections (wirebonds) as described in FIG. 2B or via flip-chip interconnections (flip-chip bonds) as described in FIG. 2C.

As used herein, an I/O ring such as the I/O ring 209 refers to a collection of I/O cells disposed on a plurality of dies or chips along a periphery of a package. For instance, as illustrated in FIG. 2A, each of the I/O cells on the dies may be located around the periphery of the package in the absence of any centrally located I/O cells. Thus, unlike some other approaches such as in various flip-chip approaches, the I/O cells (and the corresponding RV) may be located around the periphery of an IC in the absence of any centrally located I/O cells (located at or near a center of the IC). That is, as illustrated in FIG. 2A, there is an absence of I/O cells in a center portion (e.g., the center portion 366 as illustrated in FIG. 3) of the IC 250. Instead, each of the I/O cells (and dies) is located in the periphery which is more proximate to a side face of an IC such as the IC 250 than the center portion of the IC. Having the I/O cells located around the periphery of the package 204 can promote aspects herein such as permitting the I/O cells 208 on the dies 202 to be selectively bonded via either wirebonds or flip-chip bonds to the package 204.

As discussed, each of the I/O group 202 may include I/O cells and corresponding RV. As illustrated in FIG. 2A, the first I/O group 202-1 may include I/O cells 208-1 to 208-I and RV 210-1 to 210-V, the second I/O group 202-2 may include I/O cells 208-1 to 208-I and RV 210-1 to 210-V, the third I/O group 202-3 may include I/O cells 208-1 to 208-I and RV 210-1 to 210-V, and the fourth I/O group 202-1 may include I/O cells 208-1 to 208-I and RV 210-1 to 210-V. The I/O group 202 can include the same quantity or different quantities of I/O cells and/or RV. Each RV may extend through the package 204 to a respective I/O cell in a given die, as described in greater detail in FIG. 3. In some examples, each RV of the plurality of RV in a given die may be located in substantially the same location in the respective I/O cell of the plurality of I/O cells on the die, as illustrated in FIG. 2A. Having each RV in a given die be in substantially the same relative location in a given I/O cell can promote aspects herein such as permitting the I/O cells on the dies to be selectively bonded via either wirebonds or flip-chip bonds to the package 204.

FIG. 2B illustrates another example of an IC 252 including I/O cells forming an I/O ring 209 configured with a first packaging type (wirebond) in accordance with some embodiments of the present disclosure. As illustrated in FIG. 2B, each of the I/O cell in the IC 252 can be bonded to the package 204 via in-line wirebonds (e.g., 222-1, 222-2, 222-3, 222-4, 222-5, 222-6, 222-7, 222-8, 222-9, 222-10, 222-11, 222-12, 222-13, 222-14, 222-15, . . . , 222-B) at a first pitch, as described herein.

FIG. 2C illustrates an example of an IC 254 including I/O cells forming an I/O ring 209 configured with a second packaging type (flip-chip bonds) in accordance with some embodiments of the present disclosure. As illustrated in FIG. 2C, each of the I/O cell in the IC 254 can be bonded to the package 204 (or other circuitry) via staggered flip-chip bonds (e.g., 224-1, 224-2, 224-3, 224-4, 224-5, 224-6, 224-6, 224-7, 224-8, 224-9, 224-10, 224-11, 224-12, 224-13, 224-14, 224-15, . . . , 224-F) at a second pitch, as described herein. For instance, each I/O cell of the I/O group on a given die can have a corresponding flip-chip bond that is directly or indirectly coupled to the I/O cell, as illustrated in FIG. 2C. For example, half of the I/O cells on a given die can be directly coupled to a corresponding flip-chip bond while the other half of the interconnections of a given die can be located above a bond area (e.g., bond area 212-1 in the first I/O group 202-1, bond area 212-2 in the second I/O group 202-2, bond area 212-3 in the third I/O group 202-3, and/or bond area 212-4 in the fourth I/O group 202-4) and can be indirectly coupled (via a respective interconnect such as the metal wires 229-1, 229-2, 229-3, 229-4, 229-5, 229-6, 229-7, and 229-L or other conductor in a die or other circuitry) to the I/O cells, as illustrated in FIG. 2C. While not illustrated in FIG. 2A, the interconnect wires 229 or other conductors can be present in the initial apparatus prior to flip-chip bonding or can be included as part of the flip-chip bonding process. For instance, in some embodiments, once designated for flip-chip bonding the leads 229 or other conductors can be formed in the apparatus and subsequently flip-chip interconnections can be formed. It is noted that the interconnect wires 229 are illustrated in I/O group 202-1 but are omitted from the other I/O groups (202-2, 202-3, 202-4) in FIG. 2C for ease of illustration.

As illustrated in FIG. 2C, in some embodiments centrally located flip-chip interconnections 227-1, 227-2, 227-4, 227-5, . . . , 222-M (referred to herein as centrally located flip-chip interconnections 227) can be located in an central portion (located between the dies 202) of the IC. The quantity and/or a configuration of the centrally located interconnections can be varied from the quantity and/or configured illustrated in FIG. 2C. Having at least some centrally located flip-chip interconnections 227 in embodiments employing flip-chip bonding can add structural stability and/or permit routing of ground and power connections via the centrally located flip-chip interconnections 227.

FIG. 3 illustrates another example of an apparatus 358 including an IC 359 including dies or chips forming an I/O ring configured for selectable packaging types in accordance with some embodiments of the present disclosure. The IC 359 can be analogous to the IC 252 as described in FIG. 2B or the IC 254 described in FIG. 2C. That is, the IC 359 can include wirebonded interconnections or flip-chip bonded interconnections, as described herein.

The IC 359 can include a package 304. As mentioned, the package 304 refers to any semiconductor package to which dies can be bonded. As mentioned, the package 304 can include a plurality of faces (surfaces) such as a first (top) face 305-1 and a second (bottom) face 305-2 that is located on an opposite side of the package 304 from the first face 305-1, as illustrated in FIG. 3.

The IC 359 can include I/O groups 302-1, 302-2, 302-3, and 302-4 (collectively referred to herein as I/O ring 309) disposed in respective locations on a first face of the IC 359. The I/O groups 302-1, 302-2, 302-3, and 302-4 can be analogous to I/O groups 202-1, 202-2, 202-3, and 202-4, respectively, as described in FIG. 2A. However, for ease of illustration some elements (e.g., some I/O cells, interconnects between the I/O cells and the package, etc.) of the I/O groups 302-1, 302-2, 302-3, and 302-4 are omitted. That is, the I/O cells on the dies can be coupled via wirebonded interconnects or flip-chip interconnects to corresponding I/O cells, bond pads or other circuitry on the package 304.

In some embodiments, each of the I/O cells 308 on the IC 359 can be bonded via wirebonded interconnects in the absence of any flip-chip interconnections. Conversely, in some embodiments each of I/O cells 308 on the IC 359 can be bonded via flip-chip interconnects in the absence of any wirebonded interconnections.

As mentioned, the IC 359 can be free of any I/O cells and interconnections (e.g., wirebonded interconnections and/or flip-chip interconnections) located within a center portion 366 of the package 304, in some embodiments. However, in some embodiments, flip-chip interconnections can be located within the center portion 366, as described herein. While four individual I/O groups are illustrated in FIG. 3, any quantity of I/O cells 308 can be coupled to the package 304.

Once the I/O cells of the IC 359 are selectively bonded to the package 304, the IC 359 may be coupled to a motherboard such as a printed circuit board (PCB) 370. For instance, the IC 359 (e.g., the bottom face 305-2 of the package included in the IC 359) may be coupled to the PCB 370 via a plurality of package pins including a first package pin 360-1, a second package pin 360-2, a third package pin 360-3, a fourth package pin 360-4, a fifth package pin 360-5, a sixth package pin 360-6, a seventh package pin 360-7, an eighth package pin 360-9, . . . , and a $P^{th}$ package pin 360-P (collectively referred to herein as package pins 360), as illustrated in FIG. 3. While FIG. 3 illustrates the active surface of the dies 302 as being "face up" relative to the PCB 370, in some embodiments such as those employing flip-chip interconnections the active face of the dies 302 can be "face down" relative to the PCB 370, as described herein.

In some embodiments, a quantity of the package pins 360 can be equal to a quantity of the RV 310 in a given IC 359. For instance, each die can have the same quantity of RV and corresponding package pins. For example, the quantity of RV 310-1 to 310-V in the first die 302-1 can be higher or equal to a quantity of package pins 360 corresponding to the first die 302-1.

Figure 4:
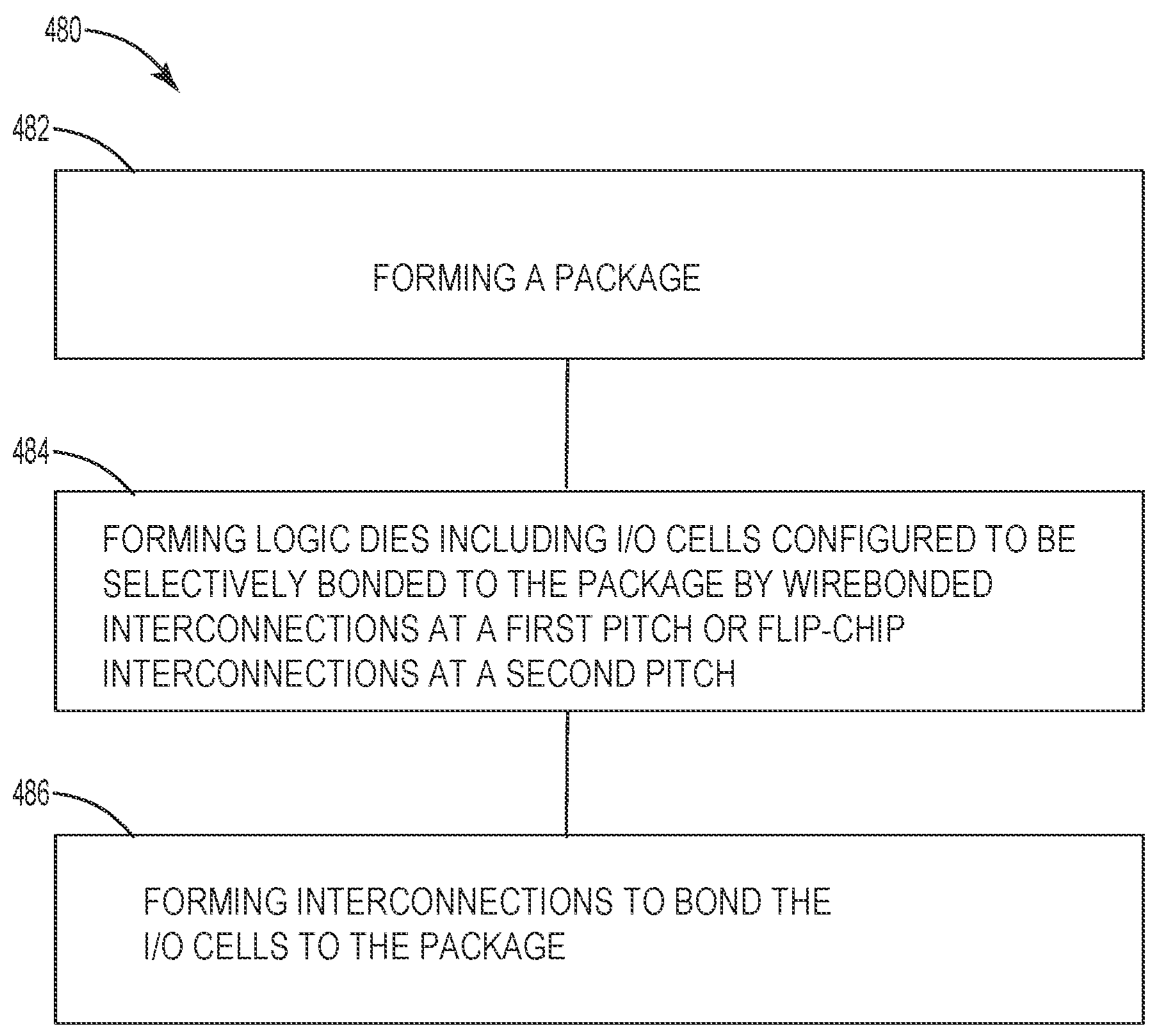
FIG. 4 illustrates an example method of forming an integrated circuit with selectable packaging types in accordance with some embodiments of the present disclosure.

FIG. 4 illustrates and example method 480 of forming an integrated circuit with selectable packaging types in accordance with some embodiments of the present disclosure. At 482, the method 480 can include formation of a package such the packages described herein. Formation of the package can be performed with conventional methodologies. At 484, the method 480 can include forming logic dies. The logic dies can be formed via conventional methodologies (e.g., singulated from a wafer, etc.) but with the proviso that at least the I/O cells are configured as described herein to permit formation of integrated circuits with selectable packaging types. For instance, the I/O cells can be configured to be selectively bonded to a package by wirebonded interconnections at a first pitch or flip-chip interconnections at a second pitch that is larger than the first pitch.

At 486, the method 480 can include formation of interconnects (e.g., electrical interconnections) that couple the I/O cells to the package (e.g., to form an integrated circuit in which the I/O cells are bonded via the interconnects to the package). As mentioned, the interconnects can be wirebonded interconnections formed at a first pitch or can be flip-chip interconnections formed at a second pitch. Thus, in some embodiments forming the interconnections can include forming wirebonded interconnections at the first pitch. For instance, the wirebonded interconnections can be formed at the first pitch in the absence of any flip-chip bonded interconnections. In some embodiments, forming the wirebonded interconnections can include forming the wirebonded interconnections at the first pitch to bond each of the plurality of I/O cells to the package. However, in some embodiments forming the interconnections can include forming flip-chip interconnections at the second pitch. For instance, the flip-chip bonded interconnections can be formed at the second pitch in the absence of any wire-bonded interconnections. In some embodiments, forming the flip-chip interconnections can include forming the flip-chip interconnections at the second pitch to bond each of the plurality of I/O cells to the package.

Aspects of the present disclosure relate to an apparatus. The apparatus can be specially constructed for various intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

Various general purpose systems can be used with programs in accordance with the teachings herein, or it can prove convenient to construct a more specialized apparatus. The structure for a variety of these systems will appear as set forth in the description herein. In addition, the present disclosure is not described with reference to any particular programming language. It will be appreciated that a variety of programming languages can be used to implement the teachings of the disclosure as described herein.

The figures herein follow a numbering convention in which the first digit corresponds to the drawing figure number and the remaining digits identify an element or component in the drawing. For example, reference numeral 102 may refer to element 102 in FIG. 1A and an analogous element may be identified by reference numeral 302 in FIG. 3.

Elements shown in the various figures herein can be added, exchanged, and/or eliminated to provide additional examples of the disclosure. In addition, the proportion and the relative scale of the elements provided in the figures are intended to illustrate the examples of the disclosure, and should not be taken in a limiting sense. In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:

a die with a first face, a second face opposite the first face, and a third face located between the first face and the second face;

I/O cells coupled to the first face of the die, wherein the I/O cells are configured to be selectively bonded to a package by wirebonded interconnections at a first pitch or flip-chip interconnections at a second pitch that is larger than the first pitch; and a bond area including decoupling capacitors that is located between each I/O cell of the I/O cells and the third face of the die.

2. The apparatus of claim 1, wherein the second pitch is two times larger than the first pitch.

3. The apparatus of claim 2, wherein the first pitch is substantially equal to 55 micrometers (μm) and the second pitch is substantially equal to 110 μm.

4. The apparatus of claim 1, wherein the die is a logic die or a memory die.

5. The apparatus of claim 1, wherein each I/O cell is coupled to the first face of the die along a common axis.

6. The apparatus of claim 5, wherein each I/O cell is spaced a distance from the third face.

7. The apparatus of claim 6, wherein each I/O cell is spaced the same distance from the third face.

8. The apparatus of claim 1, wherein the quantity of I/O cells is equal to a quantity of the wirebonded interconnections or a quantity of the flip-chip interconnections.

9. A system comprising:

a package;

a plurality of logic dies coupled to a first face of the package;

a plurality of I/O cells disposed on a first face of each logic die of the plurality of the logic dies, wherein each I/O cell of the plurality of I/O cells is disposed on a respective logic die of the plurality of logic die and co-located along a common axis extending in a first horizontal direction or a second horizontal direction;

a plurality of routing vias (RV) extending from a first face of each I/O cell of the plurality of I/O cells to a bottom face of the package; and interconnections coupled to each RV of the plurality of RVs.

10. The system of claim 9, wherein each of the I/O cells are located around a periphery of the package in the absence of any centrally located I/O cells.

11. The system of claim 9, wherein the I/O cells are bonded to the package via flip-chip interconnections, and wherein a central portion of the package includes centrally-located flip-chip interconnections.

12. The system of claim 9, wherein each logic die further comprises decoupling capacitors in a bond area, and wherein a top face of the bond area is coplanar with a top face of the plurality of I/O cells.

13. The system of claim 9, wherein the interconnections further comprises a plurality of wirebonded interconnections at a first pitch, wherein each wirebonded interconnection of the plurality of wirebonded interconnections is bonded to a respective I/O cell of the plurality of I/O cells.

14. The system of claim 9, wherein the interconnections further comprises flip-chip bonded interconnections at a second pitch, wherein each flip-chip bonded interconnection of the flip-chip bonded interconnections is bonded to a respective I/O cell of the plurality of I/O cells.

15. The system of claim 14, wherein the flip-chip bonded interconnections are staggered flip-chip bonded interconnections that have adjacent flip-chip bonded interconnections staggered different distances from a side face of the package.

16. A method, comprising:

forming a package;

forming a plurality of logic dies coupled to the package, wherein the plurality of logic dies include:

a plurality of I/O cells disposed on a first face of each logic die of the plurality of the logic dies, wherein each of the plurality of I/O cells are configured to be selectively bonded to the package by wirebonded interconnections at a first pitch or flip-chip interconnections at a second pitch that is larger than the first pitch; and a plurality of routing vias (RV) extending from a first face of each I/O cell of the plurality of I/O cells to a bottom face of the package; and forming interconnections to bond the plurality of I/O cells to the package.

17. The method of claim 16, wherein forming the interconnections further comprises forming wirebonded interconnections at the first pitch.

18. The method of claim 17, wherein forming the wirebonded interconnections further comprises forming the wirebonded interconnections at the first pitch to bond each of the plurality of I/O cells to the package.

19. The method of claim 16, wherein forming the interconnections further comprises forming flip-chip interconnections at the second pitch.

20. The method of claim 19, wherein forming the flip-chip interconnections further comprises forming the flip-chip interconnections at the second pitch to bond each of the plurality of I/O cells to the package.

* * * * *